United States Patent
Chen et al.

(10) Patent No.: US 11,204,393 B2
(45) Date of Patent: Dec. 21, 2021

(54) TERMINAL DEVICE, METHOD FOR MONITORING BATTERY SAFETY THEREFOR

(71) Applicant: GUANGDONG OPPO MOBILE TELECOMMUNICATIONS CORP., LTD., Guangdong (CN)

(72) Inventors: Wei Chen, Guangdong (CN); Jun Zhang, Guangdong (CN); Yuanqing Zeng, Guangdong (CN); Zhihua Hu, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 41 days.

(21) Appl. No.: 16/684,347

(22) Filed: Nov. 14, 2019

(65) Prior Publication Data

US 2020/0081069 A1 Mar. 12, 2020

Related U.S. Application Data

(63) Continuation-in-part of application No. PCT/CN2017/110709, filed on Nov. 13, 2017.

(51) Int. Cl.
*G01R 31/392* (2019.01)
*G01R 31/3835* (2019.01)

(52) U.S. Cl.
CPC ....... *G01R 31/392* (2019.01); *G01R 31/3835* (2019.01)

(58) Field of Classification Search
None
See application file for complete search history.

(56) References Cited

U.S. PATENT DOCUMENTS

| | | | |
|---|---|---|---|
| 2004/0189257 A1* | 9/2004 | Dougherty | H02J 7/0047 320/132 |
| 2010/0194398 A1* | 8/2010 | Kawasumi | H01M 50/572 324/430 |
| 2011/0282604 A1* | 11/2011 | Nagai | G06F 1/263 702/63 |

(Continued)

FOREIGN PATENT DOCUMENTS

| CN | 101800340 A | 8/2010 |
|---|---|---|
| CN | 102303023 B | 12/2012 |

(Continued)

OTHER PUBLICATIONS

Examination report issued in corresponding European application No. 17931455.4 dated Dec. 1, 2020.

(Continued)

*Primary Examiner* — Jas A Sanghera
(74) *Attorney, Agent, or Firm* — Young Basile Hanlon & MacFarlane, P.C.

(57) ABSTRACT

Provided are a terminal device and a method for monitoring battery safety therefor. The method for monitoring battery safety includes the following. When a battery of the terminal device is in a stable state, a voltage curve of the battery is generated by acquiring in real time a voltage of the battery. A voltage drop of the battery of a preset duration is obtained according to the voltage curve. Whether the battery is abnormal is determined according to the voltage drop of the preset duration.

18 Claims, 5 Drawing Sheets

(56) References Cited

U.S. PATENT DOCUMENTS

2015/0212162 A1    7/2015    Nakayama et al.
2015/0333381 A1    11/2015    Lux et al.

FOREIGN PATENT DOCUMENTS

| | | |
|---|---|---|
| CN | 103683387 A | 3/2014 |
| CN | 104466277 A | 3/2015 |
| CN | 107271918 A | 10/2017 |
| CN | 107275690 A | 10/2017 |
| DE | 102014215298 A1 | 2/2016 |
| EP | 1158306 A2 | 11/2001 |
| JP | H0915311 A | 1/1997 |
| JP | 2002010512 A | 1/2002 |
| JP | 2010181262 A | 8/2010 |
| JP | 2011173574 A | 9/2011 |
| JP | 2012052857 A | 3/2012 |
| JP | 2012213257 A | 11/2012 |
| JP | 2014112093 A | 6/2014 |
| WO | 2016152266 A1 | 9/2016 |

OTHER PUBLICATIONS

ISR with English Translation issued in corresponding international application No. PCT/CN2017/110709 dated Aug. 15, 2018.
Extended European search report issued in corresponding European application No. 17931455.4 dated Apr. 15, 2020.
English translation of Examination Report issued in corresponding IN application No. 201917019946 dated May 20, 2020.
Japanese Office Action with English Translation for JP Application 2020-513342 dated Apr. 2, 2021. (13 pages).
Korean Notice of Preliminary Rejection with English Translation issued in corresponding KR application No. 20207006860 dated Jul. 19, 2021.
Chinese First office action with English Translation issued in corresponding CN application No. 201780065329.8 dated Sep. 2, 2021.

* cited by examiner

TERMINAL DEVICE, METHOD FOR MONITORING BATTERY SAFETY THEREFOR

CROSS-REFERENCE TO RELATED APPLICATION(S)

This application is a continuation-in-part of International Application No. PCT/CN2017/110709, filed on Nov. 13, 2017, the disclosure of which is hereby incorporated by reference in its entirety.

TECHNICAL FIELD

This disclosure relates to the technical field of terminal devices, and more particularly to an adaptor, a terminal device, a method for monitoring battery safety of a terminal device, and a system for monitoring battery safety of a terminal device.

BACKGROUND

A battery is a source of power for a terminal device such as a mobile phone and provides long-term steady power supply for the terminal device. The battery that was first used for the terminal device is a Nickel chromium battery or a Nickel-metal hydride (Ni-MH) battery. However, as a screen of the terminal device is getting larger, the terminal device is getting more powerful, etc., capacities of the Nickel chromium battery and the Ni-MH battery are already unable to satisfy requirements on power. Instead, a Lithium-ion battery has a great number of advantages. For example, due to its high energy density, the Lithium-ion battery can be made lighter and of higher capacity, charges and discharges faster, and has no memory effect compared with the Nickel chromium battery and the Ni-MH battery. In addition, the Lithium-ion battery causes the least harm to elements in the environment. Therefore, the Lithium-ion battery has gradually replaced the conventional Nickel chromium battery and the conventional Ni-MH battery.

Although the Lithium-ion battery has effectively solved the problem of battery capacity, a problem of safety still exists. For example, when the Lithium-ion battery is damaged and thus leads to a short circuit, heat is produced inside a cell. When the heat is produced too fast, the battery will probably burst into fire and explosion. Therefore, it is necessary to monitor safety of the battery to avoid accidents.

SUMMARY

A first aspect of implementations of the present disclosure provides a method for monitoring battery safety of a terminal device. The method includes the following. When a battery of the terminal device is in a stable state, a voltage curve of the battery is generated by acquiring in real time a voltage of the battery. A voltage drop of the battery of a preset duration is obtained according to the voltage curve. Whether the battery is abnormal is determined according to the voltage drop of the preset duration.

According to a second aspect of the disclosure, there is provided a terminal device. The terminal device includes a memory, a processor, and battery-safety monitoring programs which are stored in the memory and are capable of running on the processor. When executed by the processor, the battery-safety monitoring programs being configured to: generate a voltage curve of a battery of the terminal device by acquiring in real time a voltage of the battery, when the battery is fully charged and the terminal device remains coupled with an adaptor; acquire a voltage drop of the battery of a preset duration according to the voltage curve; determine whether the battery is abnormal according to the voltage drop of the preset duration.

According to a third aspect of the disclosure, there is provided a method for monitoring battery safety of a terminal device. The method includes the following. A voltage of a battery of the terminal device is detected in real time. A voltage drop of the battery of a preset duration is determined according to the voltage detected in real time. Whether the battery is abnormal is determined according to the voltage drop of the preset duration.

DETAILED DESCRIPTION

Figure 1:
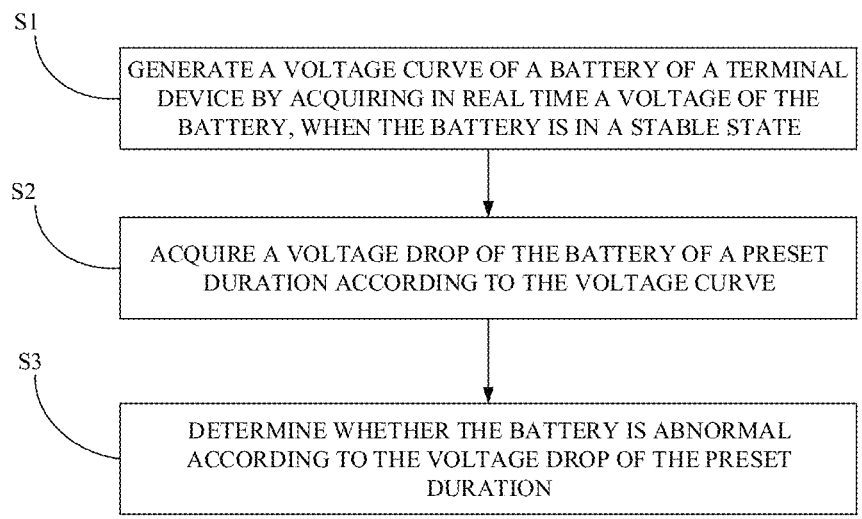
FIG. 1 is a flowchart illustrating a method for monitoring battery safety of a terminal device according to an implementation of the present disclosure.

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

Before the method for monitoring battery safety of a terminal device, the system for monitoring battery safety of a terminal device, the terminal device with the system for monitoring battery safety, and the adaptor with the system for monitoring battery safety of implementations of the present disclosure are described, a structure of a battery used for terminal devices and battery safety hazard will be first described below.

For instance, a Lithium-ion battery mainly includes a cell and a battery protection system. The cell is known as the "heart" of the Lithium-ion battery and includes anode materials and cathode materials, electrolyte, an isolation membrane, and a housing, and outside the cell is the battery protection system. The anode materials of the cell are Lithium molecular materials such as Lithium Manganate, Lithium Cobaltate, and the like. The anode materials determine energy of the battery. The cathode material is graphite. The isolation membrane is disposed between the anode and the cathode of the battery. To make it easier to understand, the isolation membrane is like a piece of paper which is continuously folded within a small battery case and filled with the anode and cathode materials and the electrolyte. In a charging process, Lithium molecules in the anode materials are activated and driven, under the action of an external electric field, to the cathode to be stored in gaps of a graphic electrode structure. Driving more Lithium molecules results in more energy stored. In a discharging process, Lithium ions in the cathode are driven to the anode and become initial Lithium molecules in the anode. The above steps are repeated to achieve charging and discharging of the battery.

The isolation membrane is mainly configured to isolate completely the anode materials from the cathode materials of the cell. Once the anode materials and the cathode materials are in direct contact, a short circuit will occur inside the battery, thereby leading to some safety hazard. Therefore, the isolation membrane cannot be too thin since a thin isolation membrane tends to be damaged. However, with more requirements on the terminal device of consumers, such as a lighter and thinner terminal device, a larger screen, and longer battery life, manufacturers start to look for a battery with higher energy density. For example, increase energy density of the battery by filling in more anode materials and more cathode materials. Nevertheless, for the same volume, more anode materials and cathode materials filled in result in thinner isolation membrane. Since the isolation membrane tends to be damaged when the battery has been subject to damage such as an external impact, the short circuit will probably occur.

As an implementation, when the battery is subject to an external mechanical damage such as squeezing, dropping, and piercing, due to thin isolation membrane, a short circuit between the anode and the cathode (that is, an internal short-circuit within the battery) tends to occur due to damage of isolation membrane. As another implementation, in a charging and discharging process of the battery, Lithium ions may accumulate in the anode and the cathode. When accumulation occurs, a type of dendrite, like crystal formed by many substances, is formed and can gradually become longer. In this process, the dendrite may also pierce the isolation membrane, thereby resulting in the internal short-circuit. Once there is short circuit, when the battery is in use, large quantities of heat will be produced inside the cell. The heat can result in vaporization of the electrolyte inside the cell. When the heat is produced too fast, the vaporization process will be very fast accordingly, which will cause increase in internal pressure of the cell. When the internal pressure reaches up to a certain extent to which the housing is unable to bear, the housing can crack, thereby resulting in explosion. When exposed to open fire, the battery can burst into fire.

In addition, besides increasingly thinner isolation membrane caused by increasing energy density, which results in damage of isolation membrane, thereby causing accidents, quick charging is also one of major factors of battery safety hazard.

Quick charging, as the name suggests, is a process of charging fast a rechargeable battery. For example, a charging process of the battery can include at least one of a trickle charging stage, a constant-current charging stage, and a constant-voltage charging stage. In the trickle charging stage, a current feedback loop can be utilized to make current flowing into the battery in the trickle charging stage satisfy expected charging current of the battery (such as a first charging current). Exemplarily, when voltage is lower than 3.0V, a 100 mA (milliampere) charging current is adopted to pre-charge the battery. In the constant-current charging stage, the current feedback loop can be utilized to make current flowing into the battery in the constant-current charging stage satisfy expected charging current of the battery (such as a second charging current, which may be larger than the first charging current). Exemplarily, the charging current can range from 0.1 C (Coulomb) to several Coulombs for different batteries, where C represents battery capacity. Generally, in the constant-current charging stage, a 0.1 C charging current is adopted for charging in a normal charging mode. However, in a quick charging mode, a charging current larger than 0.1 C is adopted for charging in the constant-current charging stage to complete charging within a short duration (in other words, time period). In the constant-voltage charging stage, a voltage feedback loop can be utilized to make voltage applied to the battery in the constant-voltage charging stage satisfy expected charging voltage of the battery. Exemplarily, when the voltage of the battery is equal to 4.2V, proceed to the constant-voltage charging stage, in which charging voltage is constantly 4.2V. When the battery is gradually fully charged, the charging current can be decreased. When the charging current is smaller than 100 mA, it can be determined that the battery is fully charged.

In the constant-current charging stage, since the charging current is large (such as 0.2 C~0.8 C, or even up to 1 C) and the charging process of the battery is an electrochemical reaction process, heat is certainly produced in this process. In addition, larger charging current leads to larger quantities of heat produced within a short duration. When the isolation membrane has been damaged, the short circuit between the anode and cathode will be easily triggered. Once short circuit occurs, more heat tends to be produced, and vaporization of the electrolyte occurs, which can cause increase in internal pressure of the cell. When the internal pressure reaches up to a certain extent to which the housing is unable to bear, the housing can crack, thereby resulting in explosion. When in contact with open fire, the battery can burst into fire.

In other words, once there is internal short-circuit in the battery, the battery is abnormal and thus some safety hazard exists, which may result in accidents when the battery is in use.

In addition, with the increase of frequency of use of the battery, flow paths for Lithium ions inside the battery will be blocked by increasing obstacles until the battery is unable to be used as usual, and such obstacles or substances accumulated at the anode and cathode of the battery will directly result in deterioration in stability of the battery. For example, some free metal substances resulting from millions of chemical reactions inside the battery will accumulate in large quantities at the anode of the battery and a minority of the free metal substances will at the same time accumulate at the cathode, which finally leads to a type of metal coating on both the anode and the cathode. In addition, the electrolyte of the battery will also damage electrodes, thus makes the anode oxidize continuously and further makes exchange of Lithium ions more difficult, thereby reducing performance of the battery. Exemplarily, charging and discharging capacities of the battery will be substantially reduced after a time period, for example, it takes longer time to fully charge the battery and the battery can be discharged within a very short time period, which makes the battery unable to be used normally.

Therefore, whether it is battery aging caused by normal use of the battery, or the internal short circuit of the battery caused by external damage or the like, great influence will be exerted on normal use of the battery, and in a more serious situation, accidents will probably be triggered. Therefore, it is necessary to determine whether the battery is abnormal. In order to detect effectively whether the battery is abnormal and avoid safety hazard of the battery, thus avoiding accidents, the present disclosure provides an effective method for monitoring safety to monitor whether the battery is abnormal.

The following will describe the method for monitoring battery safety of a terminal device, a non-transitory computer readable storage medium, the system for monitoring battery safety of a terminal device, the terminal device, and the adaptor according to implementations of the present disclosure with reference to the accompanying drawings.

It should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or another data connection line or network connection line. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with another communication terminal. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

FIG. 1 is a flowchart illustrating a method for monitoring battery safety of a terminal device according to an implementation of the present disclosure. As illustrated in FIG. 1, the method for monitoring battery safety of a terminal device provided herein can include the following. First, voltage is detected in real time, then a voltage drop of a preset duration or multiple voltage drops of multiple preset durations is acquired according to the voltage detected, and it is possible to determine whether the battery is abnormal according to the voltage drop acquired. Generally, one voltage drop can be obtained for one duration, accordingly, multiple voltage drops can be acquired for the same duration (such as 30 min after full charging) in different charging-discharging processes. Sometimes, more than a preset duration can be set to improve accuracy of abnormality detection; in this case, the method provided herein is applicable to each preset duration. The method will be detailed below.

At S1, when a battery of the terminal device is in a stable state, a voltage curve of the battery is generated by acquiring in real time a voltage of the battery. For ease of explanation as well as calculation of voltage drops, here, the "voltage curve" is introduced; however, this does not mean that the present application is necessarily to use such curve. As long as voltage of the battery is detected in real time and voltages at a start point and an end point of a duration can be determined, it will be enough to calculate the voltage drop of the duration based on the two voltages determined to implement the technical solution provided herein.

In an implementation, when the battery is fully charged and the terminal device remains coupled with an adaptor, determine that the battery is in the stable state.

Specifically, the state in which the battery is fully charged and the terminal device remains coupled with the adaptor means that the battery of the present terminal device is fully charged, and that the adaptor (such as a charger) is still coupled with the terminal device. In this case, even if background applications are not closed, battery safety detection can still be conducted. The reason is that when a display screen of the terminal device is lit up and/or applications are launched, since the adaptor remains coupled with the terminal device, power consumption of the terminal device will be supplied completely by the charger.

For instance, in general, when an alternating current (AC) power supply is utilized to supply power, most devices are unable to work directly with AC (AC current/voltage). Instead, the AC (such as 220V) provided by the AC power supply is converted into steady direct current (DC) by the adaptor, and then the DC is converted by a conversion circuit of a device to be charged (such as the terminal device), to obtain expected charging voltage and/or charging current of the battery of the device to be charged (such as the terminal device).

As an implementation, the conversion circuit can be a charging management module, such as a charging integrated circuit (IC) of a mobile terminal. In a charging process of the battery, the conversion circuit is configured to manage the charging voltage and/or the charging current of the battery. The conversion circuit functions as a voltage feedback module and/or a current feedback module to achieve management of the charging voltage and/or the charging current of the battery. For example, a user usually couples the terminal device with the adaptor before going to bed. At this time, the charging IC of the mobile terminal begins to conduct trickle charging on the battery, and then constant-current charging and constant-voltage charging. When the charging voltage reaches, for example, 4.2V and the charging current is smaller than 100 mA, the charging IC determines that the battery is fully charged. Since the adaptor is not pulled out at this time, there are still voltage and current at an input end of the conversion circuit, which indicates that the adaptor is still coupled with the terminal device. In this case, the charging IC launches an application associated with the present disclosure to start battery safety detection.

In another implementation, when the terminal device is in a screen-off standby state, determine that the battery is in the stable state.

The "screen-off standby state" means that the display screen of the terminal device is in an off-state, and all background applications are closed with only the application associated with the present disclosure launched. That is to say, during battery safety detection, the terminal device is kept in a state of nearly no power consumption, that is, the battery is kept in a natural-discharge state, which can avoid inaccuracy of detection because of power consumption of the display screen or power consumption of applications.

As an implementation, in a time period in which most users will not use the terminal device, such as a certain time period before dawn, close all background applications, switch the display screen of the terminal device to the off-state, and launch the application associated with the present disclosure, to start battery safety detection. Exemplarily, a system of the terminal device can be configured to detect whether it is currently 1:00 a.m. If yes, detect whether the display screen of the terminal device is currently in an on-state (that is, in a lit-up state). If yes, it indicates that the user may be still using the terminal device, and battery safety detection will not be carried out in this situation; otherwise, if the display screen is not in the on-state, the system automatically controls all background applications to be closed and launches the application associated with the present disclosure to start battery safety detection.

As another implementation, when battery safety detection is needed, the user can manually set the terminal device to a screen-off & low-power state. For example, the user can first launch the application associated with the present disclosure (in the following, "application" for short), then close all background applications of the system at one time through a button or option in the application, and control the display screen to be in the off-state through a power button. At this time, the application detects that all background applications of the system are closed, and that the display screen is in the off-state, and then the application will start battery safety detection.

Figure 2:
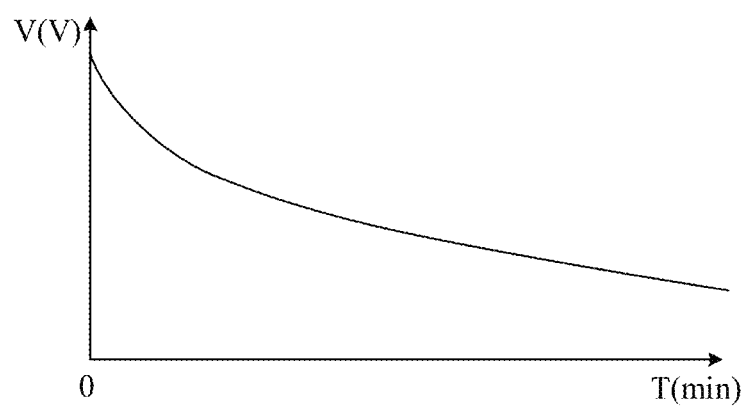
FIG. 2 is a schematic diagram illustrating a voltage curve of a battery according to an implementation of the present disclosure.

During battery safety detection, obtain a relatively stable voltage curve of the battery illustrated in FIG. 2, by continuously monitoring the voltage of the battery. In implementations of the present disclosure, voltage detection of the battery can be achieved by a voltage detecting circuit in the related art, which will not be described in detail herein.

At S2, acquire a voltage drop of the battery of a preset duration according to the voltage curve.

At S3, determine whether the battery is abnormal according to the voltage drop of the preset duration.

Specifically, when the battery is in the stable state, self-discharge will occur to the battery. Self-discharge of the battery results from internal current inside the battery which is known as leakage current, and leakage current of an abnormal battery is higher than that of a normal battery, that is, in a same duration, voltage drop of an abnormal battery is higher than that of a normal battery. Therefore, a voltage drop of the preset duration can be selected as a parameter to represent leakage current of the battery, and whether the battery is abnormal is determined according to the voltage drop in the preset duration.

For example, plug the adaptor into a mobile terminal (such as a mobile phone) to be tested, and then begin to charge the mobile terminal. After the mobile terminal is fully charged, observe drops in the voltage of the battery without pulling out the charger. For instance, a digital multimeter can be utilized to record the voltage of the battery, and data are recorded as illustrated in Table 1. Thereafter, observe, according to the data in Table 1, influence of main-board power consumption on the voltage of the battery without pulling out the adaptor.

TABLE 1

| Number | Initial Voltage Measured When Fully Charged (V) | Voltage after 1 h (V) | Voltage Variation in 1 h (mV) | Voltage after 1 h 10 min (V) | Voltage Variation in 10 min (mV) | Voltage after 1 h 20 min (V) | Voltage Variation in 20 min (mV) |
|---|---|---|---|---|---|---|---|
| 1# | 4.2883 | 4.28377 | 4.53 | 4.28358 | 0.19 | 4.28344 | 0.33 |
| 2# | 4.2935 | 4.28988 | 3.62 | 4.2897 | 0.18 | 4.28954 | 0.34 |
| 3# | 4.33375 | 4.30132 | 32.43 | 4.30106 | 0.26 | 4.30085 | 0.47 |
| 4# | 4.28713 | 4.28355 | 3.58 | 4.28336 | 0.19 | 4.2832 | 0.35 |
| 5# | 4.29083 | 4.28566 | 5.17 | 4.28544 | 0.22 | 4.28529 | 0.37 |
| 6# | 4.29926 | 4.29336 | 5.9 | 4.29305 | 0.31 | 4.29282 | 0.54 |
| 7# | 4.30773 | 4.30063 | 7.1 | 4.30035 | 0.28 | 4.30013 | 0.5 |
| 8# | 4.2945 | 4.29 | 4.5 | 4.28975 | 0.25 | 4.28954 | 0.46 |
| 9# | 4.30185 | 4.29449 | 7.36 | 4.29412 | 0.37 | 4.29386 | 0.63 |
| 10# | 4.2983 | 4.29463 | 3.67 | 4.29442 | 0.21 | 4.29426 | 0.37 |

Rated capacity of the battery is 2750 mAh, and rated voltage is 4.35V. 1# to 10# indicate ten different samples for test.

As illustrated in Table 1, without pulling out the adaptor, when the battery is normal, voltage variation (also known as "change in voltage" or "voltage change") can be kept within 1 mV in a pre-determined time period (such as 10 min) after the battery is fully charged and let stand for a time period (such as 1 h).

Then, select a new battery, charge the battery up to half of its capacity (that is, half-charged), and drop the battery repeatedly from above 1.8 m (meters) ten times (six times for corners and four times for surfaces) per round. Each time after dropping, determine heating of the battery with an infrared thermal imager. Dropping will not be stopped until a change in temperature of a local area of the battery is higher than 5° C. Thereafter, the battery is put into the mobile terminal and fully charged, and begin to observe drops in voltage after dropping without pulling out the adaptor, as illustrated in Table 2.

TABLE 2

| Number | Initial Voltage Measured When Fully Charged (V) | Voltage after 1 h (V) | Voltage Variation in 1 h (mV) | Voltage after 1 h 10 min (V) | Voltage Variation in 10 min (mV) | Voltage after 1 h 20 min (V) | Voltage Variation in 20 min (mV) |
|---|---|---|---|---|---|---|---|
| 1# | 4.35534 | 4.34492 | 10.42 | 4.34267 | 2.25 | 4.34025 | 4.67 |
| 2# | 4.3505 | 4.34040 | 10.1 | 4.34001 | 0.39 | 4.33758 | 2.82 |
| 3# | 0 after dropping | — | — | — | — | — | — |
| 4# | 3.96729 | 3.88115 | 86.14 | 3.84007 | 41.08 | 3.81649 | 64.66 |

TABLE 2-continued

| Number | Initial Voltage Measured When Fully Charged (V) | Voltage after 1 h (V) | Voltage Variation in 1 h (mV) | Voltage after 1 h 10 min (V) | Voltage Variation in 10 min (mV) | Voltage after 1 h 20 min (V) | Voltage Variation in 20 min (mV) |
|---|---|---|---|---|---|---|---|
| 5# | 4.009 | 3.89051 | 118.49 | 3.86254 | 27.97 | 3.83642 | 54.09 |
| 6# | 0 after dropping | — | — | — | — | — | — |
| 7# | 4.25526 | 4.25114 | 4.12 | 4.24989 | 1.25 | 4.24875 | 2.39 |
| 8# | 0 after dropping | — | — | — | — | — | — |
| 9# | 4.36606 | 4.36579 | 0.27 | 4.36552 | 0.27 | 4.36504 | 0.75 |
| 10# | 4.36916 | 4.36880 | 0.36 | 4.3683 | 0.5 | 4.36822 | 0.58 |

The rated capacity of the battery is 2980 mAh, and the rated voltage is 4.35V. 1# to 10# indicate ten different samples for test. In addition, after the dropping experiment, as to samples 4# and 5#, heating lasts apparently, the voltage thereof can only reach about 4V but cannot reach a higher voltage by charging.

It can be seen from Table 2 that, after the battery is damaged due to dropping, without pulling out the adaptor, voltage variation is relatively significant within a pre-determined time period (such as 10 min) after the battery is fully charged and let stand for a time period (such as 1 h). Therefore, whether the battery is abnormal can be detected with high probability according to the change in voltage, that is, whether the battery has safety hazard can be detected.

Specifically, in an implementation, when the terminal device is charged for the first time, determining whether the battery is abnormal according to the voltage drop of the preset duration can be achieved as follows. For the preset duration, obtain a corresponding reference value corresponding to the preset duration, and compare the voltage drop of the duration with the corresponding reference value. Upon determining that the voltage drop is greater than the corresponding reference value, determine that the battery is abnormal. The corresponding reference value varies with different types (such as different capacities, different materials, usage frequency, aging degree, or the like) of batteries, and as to a same type of batteries, the corresponding reference value also varies with different durations, which can be pre-obtained through an experimental test.

As an implementation, when the terminal device (specifically, the battery of the terminal device) is charged and discharged for the first time, a voltage drop of one duration in the voltage curve can be selected to determine whether the battery is abnormal. It should be noted that, even if the battery is not charged for the first time, it is still possible to use one voltage drop of a preset duration to determine whether the battery is abnormal, but the accuracy may not be ideal in this case. If it is not the first charging of the battery, that is, the battery has been charged more than one times, compared with using only one voltage drop for analysis, analysis of the voltage drop of the preset duration in different charging-discharging process can help to get better accuracy, as detailed later.

For example, the 40$^{th}$ min (minute) after the terminal device is fully charged can be selected as a start time point for calculating voltage drop, and duration T1 can be set to 30 min, (T1=30 min) and corresponding reference value a, which is equal to 8 mV (a=8 mV), is obtained according to the battery model and duration T1. When the terminal device is charged and discharged for the first time, abnormality detection of the battery begins at the 40$^{th}$ min after the terminal device is fully charged, and voltage of the battery at this time point is recorded as $V_{40\ min}$. Then when time reaches the 70$^{th}$ min after the terminal device is fully charged, voltage of the battery at this time point is recorded as $V_{70\ min}$, and voltage drop V1 in duration T1 can be calculated as $V1=V_{40\ min}-V_{70\ min}$. Then determine whether voltage drop V1 in duration T1 is greater than reference value a. If voltage drop V1 is greater than reference value a, determine that the battery is abnormal. Therefore, whether the battery is abnormal can be detected by monitoring the voltage drop of the preset duration when the battery is in the stable state, whereby prompt alert and repair can be done, thus avoiding safety hazard due to battery abnormality.

It should be noted that, the purpose of selecting the 40$^{th}$ min after the terminal device is fully charged as the start time point for calculating voltage drop is to allow the voltage of the battery to drop to a stable state. In practice, the start time point can be set to the 60$^{th}$ min after the terminal device is fully charged or the like, which depends on actual needs.

As another implementation, when the terminal device is charged and discharged for the first time, voltage drops in multiple durations (for example, two durations) in the voltage curve can be selected to determine whether the battery is abnormal, which will be elaborated as follows with voltage drops in two durations in the voltage curve selected to determine whether the battery is abnormal.

For example, the 40$^{th}$ min after the terminal device is fully charged can be selected as the start time point for calculating voltage drop. In order to quickly detect whether the battery is abnormal, duration T1 can be set to a smaller value, such as 20 min or 30 min, and meanwhile the other duration T2 can be set to a greater value, such as 50 min or 70 min. The other duration T2 has a threshold n (usually not greater than ⅔ of a total duration of discharging of the battery). In addition, duration T1 can be set to 30 min (T1=30 min), duration T2 can be set to 50 min (T2=50 min), corresponding reference value a=8 mV is obtained according to the battery model and duration T1, and corresponding reference value b=12 mV is obtained according to the battery model and duration T2.

When the terminal device is charged and discharged for the first time, battery abnormality detection begins at the 40$^{th}$ min after the terminal device is fully charged, and voltage of the battery at this time point is recorded as $V_{40\ min}$. Then, when time reaches the 70$^{th}$ min after the terminal device is fully charged, voltage of the battery at this time point is recorded as $V_{70\ min}$, and voltage drop V1 in duration T1 is calculated as $V1=V_{40\ min}-V_{70\ min}$. Thereafter, when time reaches the 120$^{th}$ min (40+T1+T2=40+30+50=120) after the terminal device is fully charged, voltage of the battery at this time point is recorded as $V_{120\ min}$, and voltage drop K1 in duration T2 is calculated as $K1=V_{70\ min}-V_{120\ min}$. Finally, determine whether voltage drop V1 in duration T1 is greater than reference value a, and determine whether voltage drop K1 in duration T2 is greater than reference value b. If voltage drop V1 is greater than reference value a or voltage drop K1 is greater than reference value b, determine that the battery is abnormal. Therefore, whether the battery is abnormal can be detected by monitoring the voltage drops in multiple durations when the battery is in the stable state, whereby prompt alert and repair can be done, thus avoiding safety hazard due to battery abnormality. In addition, compared with the above situation where only one voltage drop of one duration is used to determine battery abnormality, determining whether the battery is abnormal according to the voltage drops in multiple durations is more accurate, which is possible to effectively avoid inaccuracy of detection caused by external interference.

In an implementation, suppose the terminal device is charged more than a preset number of times.

In this case, whether the battery is abnormal according to the voltage drop of the preset duration can be determined as follows. Obtain a preset number of voltage drops by obtaining the voltage drop of the preset duration in each of a preset number of previous charging processes before present charging, obtain a corresponding reference value by calculating an average value of the preset number of voltage drops, and determine whether a difference between the voltage drop of the preset duration after present charging and the corresponding reference value is greater than a preset threshold corresponding the preset duration. Determine that the battery is abnormal upon determining that, the difference between the voltage drop of the preset duration after present charging and the corresponding reference value is greater than the corresponding preset threshold.

Different types (such as different capacities, different materials, etc.) of batteries have different corresponding preset thresholds, and a same type of batteries also have different corresponding preset thresholds in different durations, which can be obtained through an experimental test in advance.

In this implementation, an average voltage drop of consecutively multiple times of charging and discharging can be selected as reference value A, that is, $A=(V_{x+1}+V_{x+2}+ \ldots +V_{x+i})/i$, where i represents the number of times of charging and discharging, $V_{x+1}$ represents voltage drop acquired in the $1^{st}$ charging and discharging process, $V_{x+2}$ represents voltage drop acquired in the $2^{nd}$ charging and discharging process, and $V_{x+i}$ represents voltage drop acquired in the $i^{th}$ charging and discharging process. Then difference between voltage drop $V_{x+i+1}$ in the $(i+1)^{th}$ charging and discharging process and reference value A is calculated and recorded as $\Delta V$, where $\Delta V=V_{x+i+1}-A$, and determine whether difference $\Delta V$ is greater than the corresponding preset threshold. If the difference $\Delta V$ is greater than the corresponding preset threshold, determine that the battery is abnormal.

Thus, in short, for the preset duration, obtain a preset number (i) of voltage drops ($V_{x+1}$, $V_{x+2}$, . . . , $V_{x+i}$) by obtaining a voltage drop in each of a preset number of previous charging processes before present charging, calculate an average value ($A=(V_{x+1}+V_{x+2}+ \ldots +V_{x+i})/i$) of the preset number of voltage drops, and determine a difference ($\Delta V=V_{x+i+1}-A$) between a voltage drop after present charging and the average value. Then determine that the battery is abnormal if the difference ($\Delta V$) between the voltage drop and the average value is greater than the corresponding preset threshold (A).

Here, the average value of the voltage drops is used as the reference value for subsequent comparison, but the present disclosure is not limited thereto. However, the maximum voltage drop or minimum voltage drop of the voltage drops can also be used as the reference value, according to system settings or actual needs.

Specifically, as an implementation, the voltage drop of a preset duration in the voltage curve can be selected each time the terminal device is charged and discharged, to determine whether the battery is abnormal.

For example, in each charging and discharging process, the $40^{th}$ min after the terminal device is fully charged is selected as a start time point for calculating voltage drop, duration T1 is set to 30 min (T1=30 min), preset number of times i is set to 5 (i=5), and corresponding preset threshold m=5 mV is obtained according to the battery model and duration T1. Assuming that the terminal device, for which battery safety detection is to be carried out, is currently being charged and discharged for the $11^{th}$ time, since the number of times of charging has already reached up to a certain number of times, reference value A will be dynamically updated, that is, $A=(V6+V7+V8+V9+V10)/5$, where V6, V7, V8, V9, and V10 represent respectively a voltage drop of duration T1 during the $6^{th}$, the $7^{th}$, the $8^{th}$, the $9^{th}$, and the $10^{th}$ charging and discharging process. Then, compare voltage drop V11 of the $11^{th}$ charging and discharging process with the average voltage drop of previous five charging processes, in other words, calculate first difference $\Delta V$ between voltage drop V11 and reference value A, that is, $\Delta V=V11-A$, and then determine whether difference $\Delta V$ is greater than preset threshold m. If difference $\Delta V$ is greater than preset threshold m, it indicates that the battery is abnormal. Therefore, battery abnormality can be detected by monitoring the voltage drop of the preset duration in different charging-discharging processes when the battery is in the stable state and adopting a dynamic algorithm, whereby prompt alert and repair can be conducted, thereby avoiding safety hazard due to battery abnormality.

As another implementation, voltage drops in multiple durations in the voltage curve can be selected each time the terminal device is charged and discharged, to determine whether the battery is abnormal, which will be described in detail hereinafter with voltage drops in two durations in the voltage curve selected to determine whether the battery is abnormal. Here, we use two durations.

For example, in each charging and discharging process, the $40^{th}$ min after the terminal device is fully charged can be selected as the start time point for calculating voltage drop, duration T1 can be set to 30 min (T1=30 min), duration T2 can be set to 50 min (T2=50 min), preset number of times i can be set to 5 (i=5), corresponding preset threshold m=5 mV is obtained according to the battery model and duration T1, and corresponding preset threshold n=10 mV is obtained according to the battery model and duration T2. When battery safety detection is to be carried out, assuming that the terminal device is currently being charged and discharged for the $11^{th}$ time, since the number of times of charging has already reached up to a certain number of times, both reference value A corresponding to duration T1 and reference value B corresponding to duration T2 can be dynamically updated, that is, $A=(V6+V7+V8+V9+V10)/5$, and $B=(K6+K7+K8+K9+K10)/5$, where V6, V7, V8, V9, and V10 represent respectively a voltage drop of duration T1 during the $6^{th}$, the $7^{th}$, the $8^{th}$, the $9^{th}$, and the $10^{th}$ charging and discharging process, and K6, K7, K8, K9, and K10 represent respectively a voltage drop of duration T2 during the $6^{th}$, the $7^{th}$, the $8^{th}$, the $9^{th}$, and the $10^{th}$ charging and discharging process. Then, compare voltage drop V11 in duration T1 in the $11^{th}$ charging and discharging process with reference value A, and compare voltage drop K11 in duration T2 in the 11$^{th}$ charging and discharging process with reference value B, in other words, calculate difference ΔV between voltage drop V11 in duration T1 in the 11$^{th}$ charging and discharging process and reference value A, where ΔV=V11−A, and difference ΔK between voltage drop K11 in duration T2 in the 11$^{th}$ charging and discharging process and reference value B, where ΔK=K11−B, and then determine whether difference ΔV is greater than preset threshold m corresponding to duration T1 and whether difference ΔK is greater than preset threshold n corresponding to duration T2. If difference ΔV is greater than preset threshold m or difference ΔK is greater than preset threshold n, determine that the battery is abnormal. Therefore, battery abnormality can be detected by monitoring the voltage drops in multiple durations when the battery is in the stable state and adopting a dynamic algorithm, whereby prompt alert and repair can be conducted, thereby avoiding safety hazard due to battery abnormality. In addition, compared with determining whether the battery is abnormal according to the voltage drop of the preset duration in each charging and discharging process, determining whether the battery is abnormal according to the voltage drops in multiple durations is more accurate, which is possible to effectively avoid inaccuracy of detection caused by external interference.

Therefore, according to the method for monitoring battery safety of a terminal device provided herein, when the terminal device is charged more than a preset number of times, battery abnormality can be detected by monitoring the at least one voltage drop of the at least one duration when the battery is in the stable state, so that prompt alert and repair can be done, thereby avoiding safety hazard due to battery abnormality.

In an implementation, the terminal device is charged less than a preset number of times.

In this case, whether the battery is abnormal according to the voltage drop of the preset duration can be determined as follows. Obtain multiple voltage drops by obtaining the voltage drop of the preset duration in each of multiple previous charging processes before present charging, obtain a reference value corresponding to the preset duration by calculating an average value of the multiple voltage drops, and determine whether a difference between a voltage drop of the preset duration after present charging and the corresponding reference value is greater than a preset threshold corresponding to the preset duration. Determine that the battery is abnormal upon determining that the difference between the voltage drop of the preset duration after present charging and the corresponding reference value is greater than the corresponding preset threshold. As can be seen, the number of voltage drops acquired is equal to the number of times of charging of the terminal device.

If more than a preset duration is used, for each preset duration, obtain multiple voltage drops by obtaining the voltage drop of the preset duration in each of multiple previous charging processes before present charging, calculate an average value of the multiple voltage drops, and determine a difference between the voltage drop of the preset duration after present charging and the average value. Then determine that the battery is abnormal if for any one of the preset duration, the difference between the voltage drop of the preset duration after present charging and the average value is greater than the preset threshold corresponding to the preset duration. Here, for each preset duration, the number of voltage drops acquired is equal to the number of times of charging of the terminal device.

That is to say, in the implementation, when the number of times of charging of the terminal device is smaller than the preset number of times (such as five times), an average voltage drop of all previous charging and discharging processes can be used as reference value A directly to determine whether the battery is abnormal. Similarly, instead of the average voltage drop, the maximum voltage drop or minimum voltage drop can also be used for the same purpose.

As an implementation, the voltage drop of the preset duration in the voltage curve can be selected each time the terminal device is charged and discharged, to determine whether the battery is abnormal.

For example, in each charging and discharging process, select the 40$^{th}$ min after the terminal device is fully charged as a start time point for calculating voltage drop, set duration T1 to 30 min (T1=30 min), set preset number of times i to 5 (i=5), and acquire corresponding preset threshold m=5 mV according to the battery model and duration T1. When conducting battery safety detection, assuming that the terminal device is currently being charged and discharged for the 4$^{th}$ time, then reference value A can be expressed as A=(V1+V2+V3)/3, where V1, V2, and V3 represent respectively a voltage drop in duration T1 during the 1$^{st}$, the 2$^{nd}$, and the 3$^{rd}$ charging and discharging process. Then, compare voltage drop V4 in the 4$^{th}$ charging and discharging process with the average voltage drop of previous three charging and discharging processes, in other words, determine whether difference ΔV=V4−A between voltage drop V4 and reference value A is greater than preset threshold m. If difference ΔV is greater than preset threshold m, determine that the battery is abnormal. Therefore, whether the battery is abnormal can be detected by monitoring the voltage drop in the preset duration when the battery is in the stable state in each charging and discharging process, whereby prompt alert and repair can be done, thereby avoiding safety hazard caused by battery abnormality.

As another implementation, select voltage drops in multiple durations in the voltage curve each time the terminal device is charged and discharged, to determine whether the battery is abnormal, which will be elaborated hereinafter with voltage drops in two durations in the voltage curve selected to determine whether the battery is abnormal.

For instance, in each charging and discharging process, select the 40$^{th}$ min after the terminal device is fully charged as the start time point for calculating voltage drop, set duration T1 to 30 min (T1=30 min), duration T2 to 50 min (T2=50 min), and preset number of times i to five (i=5), acquire corresponding preset threshold m=5 mV according to the battery model and duration T1, and acquire corresponding preset threshold n=10 mV, according to the battery model and duration T2. When monitoring the safety of the battery, assuming that the terminal device is currently being charged and discharged for the 4$^{th}$ time, reference value A can be expressed as A=(V1+V2+V3)/3, where V1, V2, and V3 represent respectively a voltage drop in duration T1 during the 1$^{st}$, the 2$^{nd}$, and the 3$^{rd}$ charging and discharging process, and reference value B can be expressed as B=(K1+K2+K3)/3, where K1, K2, and K3 represent respectively a voltage drop in duration T2 during the 1$^{st}$, the 2$^{nd}$, and the 3$^{rd}$ charging and discharging process. Then, compare voltage drop V4 in duration T1 in the 4$^{th}$ charging and discharging process with reference value A, and compare voltage drop K4 in duration T2 in the 4$^{th}$ charging and discharging process with reference value B, in other words, determine whether difference ΔV=V4−A between voltage drop V4 and reference value A is greater than preset threshold m corresponding to duration T1, and determine whether difference ΔK=K4−B between voltage drop K4 and reference value B is greater than preset threshold n corresponding to duration T2. If difference ΔV is greater than preset threshold m or difference ΔK is greater than preset threshold n, determine that the battery is abnormal. Therefore, battery abnormality can be detected by monitoring the voltage drops in multiple durations when the battery is in the stable state, so that prompt alert and repair can be done, which avoids safety hazard because of battery abnormality. In addition, compared with determining whether the battery is abnormal according to the voltage drop of a preset duration, determining whether the battery is abnormal according to the voltage drops of multiple durations is more accurate, which is possible to effectively avoid inaccuracy of detection due to external interference.

Therefore, according to the method for monitoring battery safety of a terminal device provided herein, battery abnormality can be detected by monitoring the at least one voltage drop of the at least one duration when the battery is in the stable state, which will help with prompt alert and repair, thus avoiding safety hazard resulting from battery abnormality.

In addition, in an implementation, upon determining that the battery is abnormal, send alert information indicative of battery abnormality with the terminal device or the adaptor.

Figure 3:
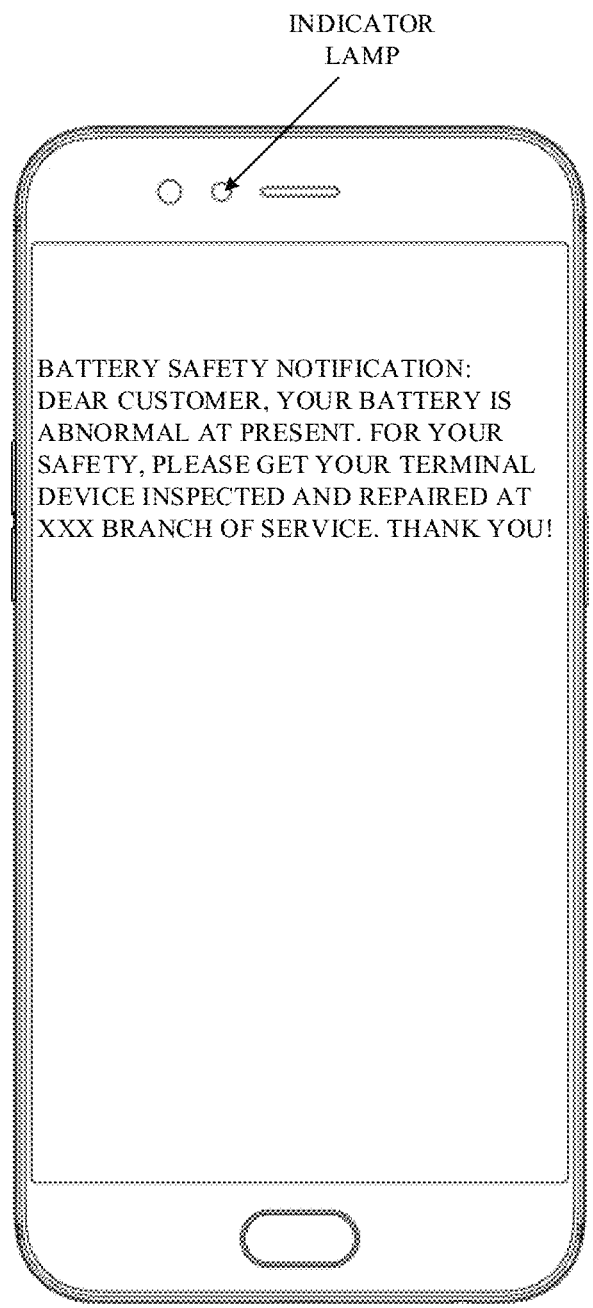
FIG. 3 is a schematic diagram illustrating alert information of a terminal device according to an implementation of the present disclosure.

For instance, when the battery is detected to be currently abnormal, it is necessary to send alert information to a user. As an implementation, as illustrated in FIG. 3, the user can be reminded by such alert information of the terminal device (such as a mobile phone) as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 3, the user can be further reminded by an indicator lamp flashing. For example, control the indicator lamp to flash on red at a high frequency. As yet another implementation, the user can be further reminded through a speech function of the terminal device.

In general, when the user receives the above alert information, the user will promptly get the terminal device inspected and repaired at a branch of service. However, some users may fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

It should be noted that, in an implementation, the adaptor can be provided with a corresponding indicator lamp, voice module, display screen, or the like, to send alert information to remind the user when the battery is abnormal. The manner in which the user is reminded can refer to the alert manner of the terminal device, which will not be repeated herein.

In an implementation, upon determining that the battery is abnormal, corresponding functions of the terminal device can be restricted.

An abnormality grade (or fault grade) can be determined according to the amount of voltage drop of the battery. For example, greater voltage drop indicates more serious battery abnormality (such as serious damage or serious aging). Accordingly, the abnormality of the battery can be classified into an average grade, a relatively serious grade, a serious grade, and a complete fault grade according to voltage drop of the battery, and thus corresponding functions of the terminal device can be restricted according to different grades.

For instance, generally speaking, lower power consumption of applications of the terminal device leads to lower heating when the battery is in use. Exemplarily, an instant messaging (IM) application is only launched without a video chat. In this case, power consumption is low, heating of the battery is low, and thus risks of the battery are less likely to occur. However, when power consumption of the applications is high, such as watching a video, playing a mobile game, etc., power consumption of the battery is high and heating of the battery is high, which can easily cause accidents. Therefore, when the battery is determined to be abnormal, in case that the abnormality grade is the average grade, forbid use of applications of high power consumption such as video applications, game applications, etc.; in case that the abnormality grade is the relatively serious grade or the serious grade, forbid directly the entire system to be launched for fear of accidents, and alert information such as "Battery is in safety risk. System disabled. Please get the terminal device inspected and repaired at xxx branch of service. Thank you for your cooperation" is displayed on the display screen of the terminal device to remind the user; in case that the abnormality grade is the complete fault grade, battery failure occurs and the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "Battery damaged. Charging disabled. Please get the terminal device inspected and repaired at xxx branch of service. Thank you for your cooperation" is displayed on the display screen of the terminal device to remind the user.

To summarize, according to the method for monitoring battery safety of a terminal device provided herein, when the battery of the terminal device is in the stable state, generate the voltage curve of the battery by acquiring in real time the voltage of the battery. Acquire the at least one voltage drop of the battery in the at least one duration according to the voltage curve. Determine whether the battery is abnormal according to the at least one voltage drop of the at least one duration. Whether the battery is abnormal can be detected by monitoring the at least one voltage drop of the at least one duration when the battery is in the stable state, which will facilitate prompt alert and repair and can avoid safety hazard due to battery abnormality.

In addition, a non-transitory computer readable storage medium is provided in an implementation of the disclosure. The non-transitory computer readable storage medium is configured to store computer programs which, when executed by a processor, are operable with the processor to execute the method for monitoring battery safety described above.

With aid of the non-transitory computer readable storage medium provided herein, by executing the above method for monitoring battery safety, whether a battery is abnormal can be detected by monitoring at least one voltage drop of at least one duration when the battery is in a stable state in order for prompt alert and repair, which avoids safety hazard due to battery abnormality.

The forgoing method is implemented in the terminal device or the adapter coupled with the terminal device. The voltage detection, the voltage curve generation, the voltage drop calculating, the comparison, and the like mentioned above can be implemented through a logic control circuit or processor built in the terminal device or the adapter. For example, the voltage detection can be achieved through a voltage detecting circuit. The result of the voltage detecting circuit can be provided to a processor for example to conduct further calculating.

The voltage of the battery can be detected by schemes in the adapter or even in a charging cable connecting the terminal device or the adapter, but it is impossible or very inconvenient for human to detect the voltage from outside without affecting the normal use of terminal device.

Figure 4:
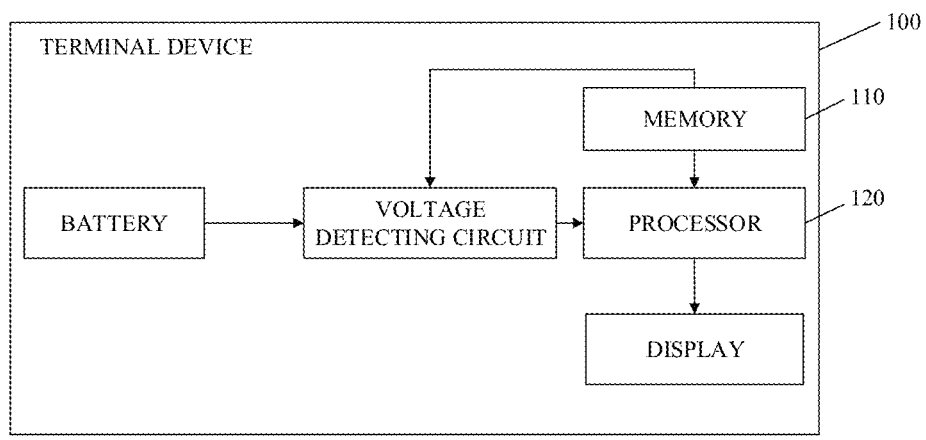
FIG. 4 is a schematic block diagram illustrating a terminal device according to an implementation of the present disclosure.

FIG. 4 is a schematic block diagram illustrating a terminal device according to an implementation of the present disclosure. As illustrated in FIG. 4, the terminal device 100 includes a memory 110, processor 120, and battery-safety monitoring programs which are stored in the memory 110 and are capable of running on the processor 120. When executed by the processor 120, the battery-safety monitoring programs are configured to execute the above method for monitoring battery safety.

The terminal device further includes a voltage detecting circuit coupled with the battery to detect the voltage of the battery in real time. The voltage thus detected can be provided to the processor 120 to generate a voltage cure, for example, the curve illustrated in FIG. 2, to obtain the voltage drop(s) in a duration(s). So the processor 120 can simply use the voltage detected through the voltage detecting circuit to obtain the voltage drop directly without generating the voltage curve. Once the processor 120 determines that the battery is abnormal according to the voltage drop, the processor can control to display alert information on the terminal device and can further disable some functions or applications of the terminal device.

With aid of the terminal device provided herein, by executing the above method for monitoring battery safety, whether a battery is abnormal can be detected by monitoring at least one voltage drop of at least one duration when the battery is in a stable state, whereby prompt alert and repair can be conducted, which avoids safety hazard due to battery abnormality.

Figure 5:
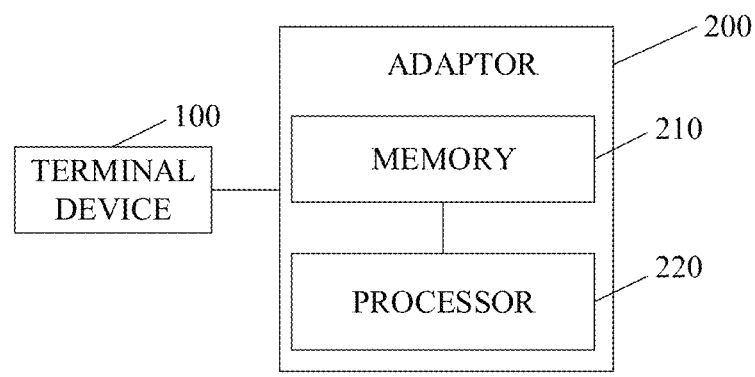
FIG. 5 is a schematic block diagram illustrating an adaptor according to an implementation of the present disclosure.

FIG. 5 is a schematic block diagram illustrating an adaptor according to an implementation of the present disclosure. As illustrated in FIG. 5, the adaptor 200 is configured to conduct two-way communication with the terminal device 100 when a connection is established between the adaptor 200 and the terminal device 100. The adaptor 200 includes a memory 210, a processor 220, and battery-safety monitoring programs which are stored in the memory 210 and are capable of running on the processor 220. The battery-safety monitoring programs are configured to execute the above method for monitoring battery safety when executed by the processor 220.

With aid of the adaptor provided herein, by executing operations of the above method for monitoring battery safety, whether a battery is abnormal can be detected by monitoring at least one voltage drop of at least one duration when the battery is in a stable state in order for timely alert and repair, which avoids safety hazard due to battery abnormality.

Figure 6:
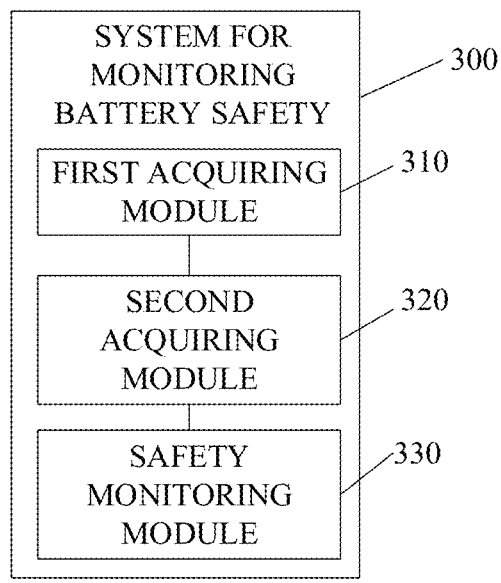
FIG. 6 is a schematic block diagram illustrating a system for monitoring battery safety of a terminal device according to an implementation of the present disclosure.

FIG. 6 is a schematic block diagram illustrating a system for monitoring battery safety of a terminal device according to an implementation of the present disclosure. As illustrated in FIG. 6, the system 300 for monitoring battery safety of a terminal device includes a first acquiring module 310, a second acquiring module 320, and a safety monitoring module 330. The modules can be integrated into a processor (such as the processor illustrated in FIG. 4 or FIG. 5) or controller.

The first acquiring module 310 is configured to generate a voltage curve of a battery of the terminal device by acquiring in real time a voltage of the battery when the battery is in a stable state. The second acquiring module 320 is configured to acquire at least one voltage drop of the battery of at least one duration according to the voltage curve. The safety monitoring module 330 is configured to determine whether the battery is abnormal according to the at least one voltage drop of the at least one duration.

In an implementation, the safety monitoring module 330 is configured to determine that the battery is in the stable state when the battery is fully charged and the terminal device remains coupled with an adaptor.

Specifically, the state in which the battery is fully charged and the terminal device remains coupled with the adaptor means that the battery of the present terminal device is fully charged, and that the adaptor (such as a charger) is still coupled with the terminal device. In this case, even if background applications of the terminal device are not closed, battery safety detection can still be conducted. The reason is that when a display screen of the terminal device is lit up and/or applications are launched, since the adaptor remains coupled with the terminal device, power consumption of the terminal device will be supplied completely by the charger.

For instance, in general, when an AC power supply is utilized to supply power, most devices are unable to work directly with AC. Instead, the AC (such as 220V) provided by the AC power supply is converted into steady DC by the adaptor, and then the DC is converted by a conversion circuit of a device to be charged (such as the terminal device), to obtain expected charging voltage and/or charging current of the battery of the device to be charged (such as the terminal device).

As an implementation, the conversion circuit can be a charging management module, such as a charging IC of a mobile terminal. In a charging process of the battery, the conversion circuit is configured to manage the charging voltage and/or the charging current of the battery. The conversion circuit functions as a voltage feedback module and/or a current feedback module to achieve management of the charging voltage and/or the charging current of the battery. For example, a user usually couples the terminal device with the adaptor before going to bed. At this time, the charging IC of the mobile terminal begins to conduct trickle charging on the battery, and then constant-current charging and constant-voltage charging. When the charging voltage reaches, for example, 4.2V and the charging current is smaller than 100 mA, the charging IC determines that the battery is fully charged. Since the adaptor is not pulled out at this time, there are still voltage and current at an input end of the conversion circuit, which indicates that the adaptor is still coupled with the terminal device. In this case, the charging IC sends such a state to the safety monitoring module 330, and the safety monitoring module 330 determines that the battery is in the stable state.

It can be understood that, the safety monitoring module 330 can also be directly configured to determine whether the battery is currently in the stable state according to the charging voltage and the charging current of the battery and voltage and current at the input end of the conversion circuit. However, based on a function of the charging IC in the related art, a state of the battery can be acquired directly by the charging IC.

In another implementation, the safety monitoring module 330 is configured to determine that the battery is in the stable state when the terminal device is in a screen-off standby state.

The "screen-off standby state" means that the display screen of the terminal device is in an off-state, and all background applications are closed with only the system for monitoring battery safety of the present disclosure launched. That is to say, during battery safety detection, the terminal device is kept in a state of nearly no power consumption, that is, the battery is kept in a discharge state, which can avoid inaccuracy of detection because of power consumption of the display screen or power consumption of applications.

As an implementation, in a duration in which most users will not use the terminal device, such as a certain duration before dawn, close all background applications, switch the display screen of the terminal device to the off-state, and launch the system for monitoring battery of the present disclosure, to start battery safety detection. Exemplarily, whether it is currently 1:00 a.m. can be detected by the safety monitoring module 330 of the system. If yes, the safety monitoring module 330 further detects whether the display screen of the present terminal device is in an on-state. If yes, it indicates that the user may be still using the terminal device, and battery safety detection will not be carried out in this situation; if the display screen is not in the on-state, the safety monitoring module 330 automatically controls all background applications to be closed to start battery safety detection.

As another implementation, when battery safety detection is needed, the user can manually set the terminal device to a screen-off & low-power state. For example, the user can first launch the application for monitoring battery safety of the present disclosure, then close all background applications of a system at one time through a button or option in the system for monitoring battery safety, and control the display screen to be in the off-state through a power button. At this time, the system for monitoring battery safety detects that all background applications of the system are closed, and that the display screen is in the off-state, and then the system for monitoring battery safety will start battery safety detection.

During battery safety detection, obtain a relatively stable voltage curve of the battery, as illustrated in FIG. 2, by continuously monitoring, with the first acquiring module 310, the voltage of the battery, then the at least one voltage drop of the at least one duration is acquired with the second acquiring module 320 according to the voltage curve, and whether the battery is abnormal is determined with the safety monitoring module 330 according to the at least one voltage drop of the at least one duration.

Specifically, in one implementation, when the terminal device is charged for the first time, the safety monitoring module 330 is further configured to, for each of the at least one duration, obtain a corresponding reference value and compare a voltage drop of the duration with the corresponding reference value, and configured to determine that the battery is abnormal upon determining that for any one of the at least one duration, the voltage drop is greater than the corresponding reference value. Different types (such as different capacities, different materials, or the like) of batteries have different corresponding reference values, and a same type of batteries also have different corresponding reference values in different durations, which can be pre-obtained by an experimental test.

As an implementation, when the terminal device is charged and discharged for the first time, the voltage drop of the preset duration in the voltage curve can be selected to determine whether the battery is abnormal.

For example, the $40^{th}$ min after the terminal device is fully charged can be selected as a start time point for calculating voltage drop, and duration T1 can be set to 30 min (T1=30 min), and corresponding reference value a, which is equal to 8 mV (a=8 mV), is obtained according to the battery model and duration T1. When the terminal device is charged and discharged for the first time, abnormality detection of the battery begins at the $40^{th}$ min after the terminal device is fully charged, and the second acquiring module 320 records voltage of the battery at this time point as $V_{40\ min}$. Then when time reaches the $70^{th}$ min after the terminal device is fully charged, the second acquiring module 320 records voltage of the battery at this time point as $V_{70\ min}$, and calculates voltage drop V1 in duration T1 as V1=$V_{40\ min}$-$V_{70\ min}$. Then, the safety monitoring module 330 determines whether voltage drop V1 in duration T1 is greater than reference value a in duration T1. If voltage drop V1 is greater than reference value a, determine that the battery is abnormal. Therefore, whether the battery is abnormal can be detected by monitoring the voltage drop of the preset duration when the battery is in the stable state, whereby prompt alert and repair can be done, thus avoiding safety hazard due to battery abnormality.

It should be noted that, the purpose of selecting the $40^{th}$ min after the terminal device is fully charged as the start time point for calculating voltage drop is to allow the voltage of the battery to drop to a stable state. In practice, the start time point can be set to the $60^{th}$ min after the terminal device is fully charged or the like, which depends on actual needs.

As another implementation, when the terminal device is charged and discharged for the first time, voltage drops in multiple durations in the voltage curve can be selected to determine whether the battery is abnormal, which will be elaborated as follows with voltage drops in two durations in the voltage curve selected to determine whether the battery is abnormal.

For example, the $40^{th}$ min after the terminal device is fully charged can be selected as the start time point for calculating voltage drop. In order to quickly detect whether the battery is abnormal, duration T1 can be set to a smaller value, such as 20 min or 30 min, and meanwhile the other duration T2 can be set to a greater value, such as 50 min or 70 min. The other duration T2 has a threshold n (usually not greater than ⅔ of a total duration of discharging of the battery). In addition, duration T1 can be set to 30 min (T1=30 min), duration T2 can be set to 50 min (T2=50 min), corresponding reference value a=8 mV is obtained according to the battery model and duration T1, and corresponding reference value b=12 mV is obtained according to the battery model and duration T2.

When the terminal device is charged and discharged for the first time, battery abnormality detection begins at the $40^{th}$ min after the terminal device is fully charged, and the second acquiring module 320 records voltage of the battery at this time point as $V_{40\ min}$. Then, when time reaches the $70^{th}$ min after the terminal device is fully charged, the second acquiring module 320 records voltage of the battery at this time point as $V_{70\ min}$, and calculates voltage drop V1 in duration T1 as V1=$V_{40\ min}$-$V_{70\ min}$. Thereafter, when time reaches the $120^{th}$ min after the terminal device is fully charged, the second acquiring module 320 records voltage of the battery at this time point as $V_{20\ min}$, and calculates voltage drop K1 in duration T2 as K1=$V_{70\ min}$-$V_{120\ min}$. Finally, the safety monitoring module 330 determines whether voltage drop V1 in duration T1 is greater than reference value a, and meanwhile determines whether voltage drop K1 in duration T2 is greater than reference value b. If voltage drop V1 is greater than reference value a or voltage drop K1 is greater than reference value b, determine that the battery is abnormal. Therefore, whether the battery is abnormal can be detected by monitoring the voltage drops in multiple durations when the battery is in the stable state, whereby prompt alert and repair can be done, thus avoiding safety hazard due to battery abnormality. In addition, compared with the above situation where only one voltage drop of one duration is used to determine battery abnormality, determining whether the battery is abnormal according to the voltage drops in multiple durations is more accurate, which is possible to effectively avoid inaccuracy of detection caused by external interference.

In an implementation, when the terminal device is charged more than a preset number of times, the safety monitoring module 330 is further configured to, for each of the at least one duration, obtain a preset number of voltage drops by obtaining, with the second acquiring module 320, a voltage drop in each of a preset number of previous charging processes before present charging, obtain a corresponding reference value by calculating an average value of the preset number of voltage drops, and determine whether a difference between a voltage drop after present charging and the corresponding reference value is greater than a corresponding preset threshold, and configured to determine that the battery is abnormal upon determining that for any one of the at least one duration, the difference between the voltage drop and the corresponding reference value is greater than the corresponding preset threshold.

Different types (such as different capacities, different materials, etc.) of batteries have different corresponding preset thresholds, and a same type of batteries also have different corresponding preset thresholds in different durations, which can be obtained through an experimental test in advance.

That is to say, in the implementation, an average voltage drop of consecutively multiple times of charging and discharging can be selected as reference value A, that is, $A=(V_{x+1}+V_{x+2}+ \ldots +V_{x+i})/i$, where i represents the $i^{th}$ charging and discharging, $V_{x+1}$ represents voltage drop acquired in the $1^{st}$ charging and discharging process, $V_{x+2}$ represents voltage drop acquired in the $2^{nd}$ charging and discharging process, and $V_{x+i}$ represents voltage drop acquired in the $i^{th}$ charging and discharging process. Then difference between voltage drop $V_{x+i+1}$ in the $(i+1)^{th}$ charging and discharging process and reference value A is calculated and recorded as ΔV, where $ΔV=V_{x+i+1}-A$, and determine whether difference ΔV is greater than the corresponding preset threshold. If the difference ΔV is greater than the corresponding preset threshold, determine that the battery is abnormal.

Specifically, as an implementation, a voltage drop of one duration in the voltage curve can be selected each time the terminal device is charged and discharged, to determine whether the battery is abnormal.

For example, in each charging and discharging process, the $40^{th}$ min after the terminal device is fully charged is selected as a start time point for calculating voltage drop, duration T1 is set to 30 min (T1=30 min), preset number of times i is set to 5 (i=5), and corresponding preset threshold m=5 mV is obtained according to the battery model and duration T1. Assuming that the terminal device, for which battery safety detection is to be carried out, is currently being charged and discharged for the $11^{th}$ time, since the number of times of charging has already reached up to a certain number of times, reference value A will be dynamically updated, that is, reference value A acquired by the second acquiring module 320 is expressed as $A=(V6+V7+V8+V9+V10)/5$, where V6, V7, V8, V9, and V10 represent respectively a voltage drop of duration T1 during the $6^{th}$, the $7^{th}$, the $8^{th}$, the $9^{th}$, and the $10^{th}$ charging and discharging process. Then, the safety monitoring module 330 compares voltage drop V11 of the $11^{th}$ charging and discharging process with the average voltage drop of previous five charging processes, in other words, calculates first difference ΔV between voltage drop V11 and reference value A, that is, $ΔV=V11-A$, and then determines whether difference ΔV is greater than preset threshold m. If difference ΔV is greater than preset threshold m, it indicates that the battery is abnormal. Therefore, battery abnormality can be detected by monitoring a voltage drop of a preset duration in different charging-discharging processes when the battery is in the stable state and adopting a dynamic algorithm, whereby prompt alert and repair can be conducted, thereby avoiding safety hazard due to battery abnormality.

As another implementation, voltage drops in multiple durations in the voltage curve can be selected each time the terminal device is charged and discharged, to determine whether the battery is abnormal, which will be described in detail hereinafter with voltage drops in two durations in the voltage curve selected to determine whether the battery is abnormal.

For example, in each charging and discharging process, the $40^{th}$ min after the terminal device is fully charged can be selected as the start time point for calculating voltage drop, duration T1 can be set to 30 min (T1=30 min), duration T2 can be set to 50 min (T2=50 min), preset number of times i can be set to 5, corresponding preset threshold m=5 mV is obtained according to the battery model and duration T1, and corresponding preset threshold n=10 mV, is obtained according to the battery model and duration T2. When battery safety detection is to be carried out, assuming that the terminal device is currently being charged and discharged for the $11^{th}$ time, since the number of times of charging has already reached up to a certain number of times, both reference value A corresponding to duration T1 and reference value B corresponding to duration T2 can be dynamically updated, that is, reference value A and reference value B acquired by the second acquiring module 320 are respectively expressed as $A=(V6+V7+V8+V9+V10)/5$ and $B=(K6+K7+K8+K9+K10)/5$, where V6, V7, V8, V9, and V10 represent respectively a voltage drop of duration T1 during the $6^{th}$, the $7^{th}$, the $8^{th}$, the $9^{th}$, and the $10^{th}$ charging and discharging process, and K6, K7, K8, K9, and K10 represent respectively a voltage drop of duration T2 during the $6^{th}$, the $7^{th}$, the $8^{th}$, the $9^{th}$, and the $10^{th}$ charging and discharging process. Then, the safety monitoring module 330 compares voltage drop V11 in duration T1 in the $11^{th}$ charging and discharging process with reference value A, and compares voltage drop K11 in duration T2 in the $11^{th}$ charging and discharging process with reference value B, in other words, calculates first difference ΔV between voltage drop V11 in duration T1 in the $11^{th}$ charging and discharging process and reference value A, where $ΔV=V11-A$, and difference ΔK between voltage drop K11 in duration T2 in the $11^{th}$ charging and discharging process and reference value B, where $ΔK=K11-B$, and then determines whether difference ΔV is greater than preset threshold m corresponding to duration T1 and whether difference ΔK is greater than preset threshold n corresponding to duration T2. If difference ΔV is greater than preset threshold m or difference ΔK is greater than preset threshold n, determine that the battery is abnormal. Therefore, battery abnormality can be detected by monitoring the voltage drops in multiple durations when the battery is in the stable state and adopting a dynamic algorithm, whereby prompt alert and repair can be conducted, thereby avoiding safety hazard due to battery abnormality. In addition, compared with determining whether the battery is abnormal according to a voltage drop of a preset duration in each charging and discharging process, determining whether the battery is abnormal according to the voltage drops in multiple durations is more accurate, which is possible to effectively avoid inaccuracy of detection caused by external interference.

Therefore, with aid of the system for monitoring battery safety of a terminal device provided herein, battery abnormality can be detected by monitoring the at least one voltage drop of the at least one duration when the battery is in the stable state, so that prompt alert and repair can be done, thereby avoiding safety hazard due to battery abnormality.

In an implementation, when the terminal device is charged less than a preset number of times, the safety monitoring module 330 is further configured to, for each of the at least one duration, obtain multiple voltage drops by obtaining, with the second acquiring module 320, a voltage drop in each of multiple previous charging processes before present charging, obtain a corresponding reference value by calculating an average value of the multiple voltage drops, and determine whether a difference between a voltage drop after present charging and the corresponding reference value is greater than a corresponding preset threshold, and configured to determine that the battery is abnormal upon determining that for any one of the at least one duration, the difference between the voltage drop and the corresponding reference value is greater than the corresponding preset threshold.

That is to say, in the implementation, when the number of times of charging of the terminal device is smaller than the preset number of times (such as five times), an average voltage drop of all previous of charging and discharging processes can be used as reference value A directly to determine whether the battery is abnormal.

As an implementation, a voltage drop of a preset duration in the voltage curve can be selected each time the terminal device is charged and discharged, to determine whether the battery is abnormal.

For example, in each charging and discharging process, select the $40^{th}$ min after the terminal device is fully charged as a start time point for calculating voltage drop, set duration T1 to 30 min (T1=30 min), set preset number of times i to 5 (i=5), and acquire corresponding preset threshold m=5 mV, according to the battery model and duration T1. When conducting battery safety detection, assuming that the terminal device is currently being charged and discharged for the $4^{th}$ time, then reference value A acquired by the second acquiring module 320 is expressed as A=(V1+V2+V3)/3, where V1, V2, and V3 represent respectively a voltage drop of duration T1 during the $1^{st}$, the $2^{nd}$, and the $3^{rd}$ charging and discharging process. Then, the safety monitoring module 330 compares voltage drop V4 in the $4^{th}$ charging and discharging process with the average voltage drop of previous three charging and discharging processes, in other words, determines whether difference ΔV=V4−A between voltage drop V4 and reference value A is greater than preset threshold m. If difference ΔV is greater than preset threshold m, determine that the battery is abnormal. Therefore, whether the battery is abnormal can be detected by monitoring the voltage drop of the preset duration when the battery is in the stable state in each charging and discharging process, whereby prompt alert and repair can be done, thereby avoiding safety hazard caused by battery abnormality.

As another implementation, select voltage drops in multiple durations in the voltage curve each time the terminal device is charged and discharged, to determine whether the battery is abnormal, which will be elaborated hereinafter with voltage drops in two durations in the voltage curve selected to determine whether the battery is abnormal.

For instance, in each charging and discharging process, select the $40^{th}$ min after the terminal device is fully charged as the start time point for calculating voltage drop, set duration T1 to 30 min (T1=30 min), duration T2 to 50 min (T2=50 min), and preset number of times i to five (i=5), acquire corresponding preset threshold m=5 mV, according to the battery model and duration T1, and acquire corresponding preset threshold n=10 mV, according to the battery model and duration T2. When monitoring the safety of the battery, assuming that the terminal device is currently being charged and discharged for the $4^{th}$ time, and reference value A acquired by the second acquiring module 320 is expressed as A=(V1+V2+V3)/3, and reference value B acquired by the second acquiring module 320 is expressed as B=(K1+K2+K3)/3, where V1, V2, and V3 represent respectively a voltage drop of duration T1 during the $1^{st}$, the $2^{nd}$, and the $3^{rd}$ charging and discharging process, and K1, K2, and K3 represent respectively a voltage drop of duration T2 during the $1^{st}$, the $2^{nd}$, and the $3^{rd}$ charging and discharging process. Then, the safety monitoring module 330 compares voltage drop V4 in duration T1 in the $4^{th}$ charging and discharging process with reference value A, and compares voltage drop K4 in duration T2 in the $4^{th}$ charging and discharging process with reference value B, in other words, determines whether difference ΔV=V4−A between voltage drop V4 and reference value A is greater than preset threshold m corresponding to duration T1, and determines whether difference ΔK=K4−B between voltage drop K4 and reference value B is greater than preset threshold n corresponding to duration T2. If difference ΔV is greater than preset threshold m or difference ΔK is greater than preset threshold n, determine that the battery is abnormal. Therefore, battery abnormality can be detected by monitoring the voltage drops in multiple durations when the battery is in the stable state, so that prompt alert and repair can be done, which avoids safety hazard because of battery abnormality. In addition, compared with determining whether the battery is abnormal according to the voltage drop of the preset duration, determining whether the battery is abnormal according to the voltage drops in multiple durations is more accurate, which is possible to effectively avoid inaccuracy of detection due to external interference.

Therefore, with aid of the system for monitoring battery safety of a terminal device provided herein, battery abnormality can be detected by monitoring the at least one voltage drop of the at least one duration when the battery is in the stable state, which will help with prompt alert and repair, thus avoiding safety hazard resulting from battery abnormality.

In addition, in an implementation, the safety monitoring module 330 is further configured to control the terminal device or the adaptor to send alert information indicative of battery abnormality, upon determining that the battery is abnormal.

For instance, when the battery is detected to be currently abnormal, it is necessary to send alert information to a user. As an implementation, as illustrated in FIG. 3, the safety monitoring module 330 can be configured to remind the user by such alert information of the terminal device (such as a mobile phone) as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 3, the user can be further reminded by an indicator lamp flashing. For example, control the indicator lamp to flash on red at a high frequency. As yet another implementation, the user can be further reminded through a speech function of the terminal device.

In general, when the user receives the above alert information, the user will promptly get the terminal device inspected and repaired at a branch of service. However, some users may fail to realize the seriousness of the problem when they receive the alert information. Therefore, they are likely to ignore the alert information and continue using the terminal device as usual. In this case, the safety monitoring module 330 can be configured to remind the user multiple times. For example, the user can be reminded at least three times. When the user still does not deal with the problem after being reminded multiple times, some functions of the terminal device can be restricted.

It should be noted that, in an implementation, the adaptor can be provided with a corresponding indicator lamp, voice module, display screen, or the like, whereby the safety monitoring module 330 sends alert information with the adaptor to remind the user when the battery is abnormal. The manner in which the user is reminded can refer to the alert manner of the terminal device, which will not be repeated herein.

In an implementation, the safety monitoring module 330 is further configured to restrict corresponding functions of the terminal device, upon determining that the battery is abnormal.

That is to say, an abnormality grade is determined according to the amount of voltage drop of the battery. For example, greater voltage drop indicates more serious battery abnormality (such as serious damage or serious aging). Accordingly, the abnormality of the battery can be classified into an average grade, a relatively serious grade, a serious grade, and a complete fault grade according to voltage drop of the battery, and thus corresponding functions of the terminal device can be restricted according to different grades.

For instance, generally speaking, lower power consumption of applications of the terminal device leads to lower heating when the battery is in use. Exemplarily, an IM application is only launched without a video chat. In this case, power consumption is low, heating of the battery is low, and thus risks of the battery are less likely to occur. However, when power consumption of the applications is high, such as watching a video, playing a mobile game, etc., power consumption of the battery is high and heating of the battery is high, which can easily cause accidents. Therefore, when the battery is determined to be abnormal, in case that the abnormality grade is the average grade, the safety monitoring module 330 is configured to forbid use of applications of high power consumption such as video applications, game applications, etc.; in case that the abnormality grade is the relatively serious grade or the serious grade, the safety monitoring module 330 is configured to forbid directly the entire system to be launched for fear of accidents, and alert information such as "Battery is in safety risk. System disabled. Please get the terminal device inspected and repaired at xxx branch of service. Thank you for your cooperation" is displayed on the display screen of the terminal device to remind the user; in case that the abnormality grade is the complete fault grade, battery failure occurs and the safety monitoring module 330 is configured to control the system to be powered off and unable to be launched.

In addition, since heating can also occur in a charging process of the battery, especially in a quick charging state where more heating occurs within a short time, when the battery is determined to be abnormal, the safety monitoring module 330 is also configured to forbid quick charging of the battery. In a more serious situation, the user is even forbidden to charge the battery for fear of accidents, and alert information such as "Battery damaged. Charging disabled. Please get the terminal device inspected and repaired at xxx branch of service. Thank you for your cooperation" is displayed on the display screen of the terminal device to remind the user.

With aid of the system for monitoring battery safety of a terminal device provided herein, the first acquiring module acquires in real time the voltage of the battery of the terminal device when the battery is in the stable state, to generate the voltage curve of the battery. The second acquiring module acquires the at least one voltage drop of the battery in the at least one duration according to the voltage curve, and the safety monitoring modules determines whether the battery is abnormal according to the at least one voltage drop of the at least one duration. Whether the battery is abnormal can be detected by monitoring the at least one voltage drop of the at least one duration when the battery is in the stable state in order for prompt alert and repair, which avoids safety hazard due to battery abnormality.

Figure 7:
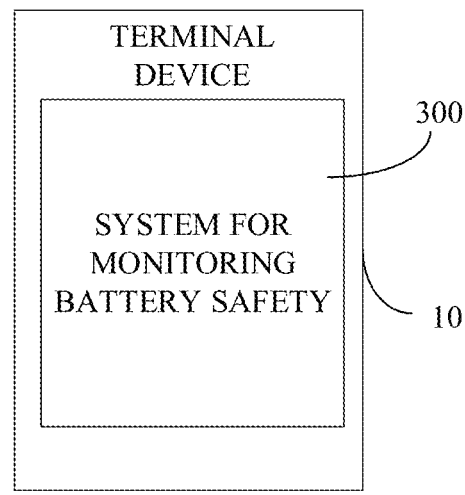
FIG. 7 is a schematic block diagram illustrating a terminal device according to another implementation of the present disclosure.

FIG. 7 is a schematic block diagram illustrating a terminal device according to another implementation of the present disclosure. As illustrated in FIG. 7, the terminal device 10 includes the system 300 for monitoring battery safety of a terminal device described above.

With aid of the terminal device provided herein, which includes the above system for monitoring battery safety of a terminal device, whether a battery is abnormal can be detected by monitoring at least one voltage drop of at least one duration when the battery is in a stable state, so that prompt alert and repair can be conducted, thus avoiding safety hazard due to battery abnormality.

Figure 8:
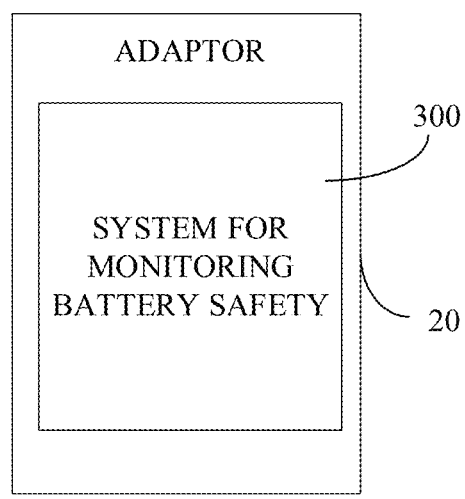
FIG. 8 is a schematic block diagram illustrating an adaptor according to another implementation of the present disclosure.

FIG. 8 is a schematic block diagram illustrating an adaptor according to another implementation of the present disclosure. As illustrated in FIG. 8, the adaptor 20 includes the above system 300 for monitoring battery safety of a terminal device.

With aid of the adaptor provided herein, which includes the above system for monitoring battery safety of a terminal device, whether a battery is abnormal can be detected by monitoring at least one voltage drop of at least one duration when the battery is in a stable state, so that timely alert and repair can be conducted, thus avoiding safety hazard due to battery abnormality.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation. The particular feature, structure, material, or characteristic described may be properly combined in any one or more embodiments or implementations. In addition, when the embodiment or implementation is not mutually exclusive with other embodiments or implementations, it is expressly and implicitly understood by those skilled in the art that an embodiment described herein may be combined with other embodiments or implementations.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Description of any process or method in a flowchart or in other manners herein can be comprehended as including a module, a segment, or a portion of executable program codes of one or more steps for implementing custom logic functions or processes. In addition, it should be appreciated by those skilled in the art that, the scope of the implementations of the present disclosure includes other implementations, in which functions can be executed in an order different from that illustrated or discussed, for example, the functions are executed approximately at the same time or executed in an opposite order.

The logic and/or steps illustrated in a flowchart or described in other manners herein can, for example, be considered as a sequence list of an executable program or instruction for implementing logical functions, be embodied in any computer readable medium for use by, or in connection with, a system, apparatus, or device for executing instructions (such as a computer-based system, a system including a processor, or other systems that can read instructions from the system, apparatus, or device for executing instructions and execute the instructions). As to the specification, the "computer readable medium" can be any apparatus which can include, store, communicate, transmit, or propagate programs for use by, or in connection with, the system, apparatus, or device for executing instructions. Examples (non-exhaustive) of the computer readable medium include an electrical connection portion (electronic device) including one or more wires, a portable computer disk box (magnetic device), a random access memory (RAM), a read-only memory (ROM), an erasable programmable read-only memory (EPROM, or flash memory), an optical fiber device, and a compact disc read-only memory (CDROM). In addition, the "computer readable medium" can even be paper or other suitable media upon which the programs can be printed, for example, an optical scanning can be conducted on paper or other media, then the programs are compiled and interpreted or otherwise processed in a suitable manner when necessary, to obtain the programs in an electronic manner, and thereafter the programs are stored in a memory of a computer.

It should be understood that, portions of the present disclosure can be implemented in hardware, software, firmware, or a combination thereof. In the above implementations, multiple steps or methods may be realized by software or firmware that is stored in the memory and executed by an appropriate instruction executing system. For example, when multiple steps or methods are implemented in hardware, like in another implementation, any one of the following which are known in the art or a combination thereof can be adopted: a discrete logic circuit of a logic gate for implementing a logical function on data signals, an application specific integrated circuit (ASIC), a programmable gate array (PGA), a field programmable gate array (FPGA), and the like.

It can be appreciated by those skilled in the art that, all or part of steps of the method of the above implementations can be completed by means of instructing relevant hardware through a program. The program can be stored in a computer readable storage medium, and when executed, the program includes any one or a combination of the steps in the method implementations.

In addition, functional units of the implementations of the disclosure can be integrated into a processing module or physically separated, or two or more units may be integrated into a module. The above integrated module can be implemented in hardware or as a software functional module. If the integrated module is implemented as a software functional module and sold or used as standalone products, it may be stored in a computer readable storage medium.

The above storage medium can be a ROM, a magnetic disk, an optical disk, or the like. While the disclosure has been described in connection with certain implementations, it is to be understood that the above implementations are illustrative and cannot be understood as limitations on the disclosure. Those of ordinary skill in the art can conduct various changes, modifications, substitutions, and alternations on the above implementations without departing from the scope of the disclosure.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. For those of ordinary skill in the art, the above terms in the present disclosure can be understood according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for monitoring battery safety of a terminal device, comprising:
generating a voltage curve of a battery of the terminal device by acquiring in real time a voltage of the battery, when the battery is in a stable state, wherein the battery is in the stable state when the battery is fully charged and the terminal device remains coupled with an adaptor;
acquiring a voltage drop of the battery of a preset duration according to whether the terminal device is charged for the first time and the voltage curve, wherein when the terminal device is not charged for the first time, the voltage drop of the preset duration is determined according to the number of times of charging of the terminal device; and
determining whether the battery is abnormal according to the voltage drop of the preset duration.

2. The method of claim 1, wherein when the terminal device is charged for the first time, determining whether the battery is abnormal according to the voltage drop of the preset duration comprises:
obtaining a reference value corresponding to the preset duration;
comparing the voltage drop with the reference value; and
determining that the battery is abnormal upon determining that the voltage drop is greater than the reference value.

3. The method of claim 2, wherein the reference value is obtained according to at least one of capacity, material, usage frequency, and aging degree of the battery.

4. The method of claim 1, wherein when the terminal device is charged more than a preset number of times,
acquiring the voltage drop of the battery of the preset duration according to whether the terminal device is charged for the first time and the voltage curve comprises:
acquiring a preset number of voltage drops by acquiring the voltage drop of the preset duration in each of a preset number of previous charging processes before present charging; and
determining whether the battery is abnormal according to the voltage drop of the preset duration comprises:
obtaining a reference value corresponding to the preset duration by calculating an average value of the preset number of voltage drops;
determining whether a difference between the voltage drop of the preset duration after present charging and the reference value is greater than a preset threshold corresponding to the preset duration; and
determining that the battery is abnormal upon determining that the difference is greater than the preset threshold.

5. The method of claim 1, wherein when the terminal device is charged less than a preset number of times,
acquiring the voltage drop of the battery of the preset duration according to whether the terminal device is charged for the first time and the voltage curve comprises:
acquiring a plurality of voltage drops by acquiring the voltage drop of the preset duration in each of a plurality of previous charging processes before present charging,
wherein the number of voltage drops acquired is equal to the number of times of charging of the terminal device; and
determining whether the battery is abnormal according to the voltage drop of the preset duration comprises:
obtaining a reference value corresponding to the preset duration by calculating an average value of the plurality of voltage drops;
determining whether a difference between the voltage drop of the preset duration after present charging and the reference value is greater than a preset threshold corresponding to the preset duration; and
determining that the battery is abnormal upon determining that the difference is greater than the preset threshold.

6. The method of claim 1, further comprising:
sending alert information indicative of battery abnormality by the terminal device or the adaptor, upon determining that the battery is abnormal.

7. The method of claim 1, further comprising:
restricting corresponding functions of the terminal device, upon determining that the battery is abnormal.

8. The method of claim 7, wherein restricting corresponding functions of the terminal device comprises:
determining abnormality grade of the battery; and
restricting corresponding functions of the terminal device according to the abnormality grade.

9. A terminal device, comprising a memory, a processor, and battery-safety monitoring programs which are stored in the memory and are capable of running on the processor, when executed by the processor, the battery-safety monitoring programs being configured to:
generate a voltage curve of a battery of the terminal device by acquiring in real time a voltage of the battery, when the battery is fully charged and the terminal device remains coupled with an adaptor;
acquire a voltage drop of the battery of a preset duration according to whether the terminal device is charged for the first time and the voltage curve, wherein when the terminal device is not charged for the first time, the voltage drop of the preset duration is determined according to the number of times of charging of the terminal device; and
determine whether the battery is abnormal according to the voltage drop of the preset duration.

10. The terminal device of claim 9, wherein when the terminal device is charged for the first time, the voltage drop of the battery is determined according to the voltage detected in real time directly, and the battery-safety monitoring programs configured to determine whether the battery is abnormal is configured to:
determine a reference value corresponding to the preset duration;
compare the voltage drop with the reference value; and
determine that the battery is abnormal upon determining that the voltage drop is greater than the reference value.

11. The terminal device of claim 10, wherein the reference value is determined according to at least of capacity, material, usage frequency, and aging degree of the battery.

12. The terminal device of claim 9, wherein when the terminal device is charged more than a preset number of times, the battery-safety monitoring programs configured to acquire the voltage drop of the battery of the preset duration according to whether the terminal device is charged for the first time and the voltage curve is configured to:
 acquire a preset number of voltage drops by acquiring the voltage drop of the preset duration in each of a preset number of previous charging processes before present charging;
the battery-safety monitoring programs configured to determine whether the battery is abnormal according to the voltage drop of the preset duration is configured to:
 obtain a reference value corresponding to the preset duration by calculating an average value of the preset number of voltage drops;
 determine whether a difference between the voltage drop of the preset duration after present charging and the reference value is greater than a preset threshold corresponding to the preset duration; and
 determine that the battery is abnormal upon determining that the difference is greater than the preset threshold.

13. The terminal device of claim 9, wherein when the terminal device is charged less than a preset number of times,
 the battery-safety monitoring programs configured to acquire the voltage drop of the battery of the preset duration according to whether the terminal device is charged for the first time and the voltage curve is configured to:
  acquire a plurality of voltage drops by acquiring the voltage drop of the preset duration in each of a plurality of previous charging processes before present charging, wherein the number of voltage drops acquired is equal to the number of times of charging of the terminal device; and
 the battery-safety monitoring programs configured to determine whether the battery is abnormal according to the voltage drop of the preset duration is configured to:
  obtain a reference value corresponding to the preset duration by calculating an average value of the plurality of voltage drops;
  determine whether a difference between the voltage drop of the preset duration after present charging and the reference value is greater than a preset threshold; and
  determine that the battery is abnormal upon determining that the difference is greater than the preset threshold.

14. A method for monitoring battery safety of a terminal device, comprising:
 detecting in real time a voltage of a battery of the terminal device when the battery is in a stable state, wherein the battery is in the stable state when the battery is fully charged and the terminal device remains coupled with an adaptor;
 determining a voltage drop of the battery of a preset duration according to whether the terminal device is charged for the first time and the voltage detected in real time; and
 determining whether the battery is abnormal according to the voltage drop of the preset duration.

15. The method of claim 14, wherein when the terminal device is charged for the first time, the voltage drop of the battery is determined according to the voltage detected in real time directly, and determining whether the battery is abnormal according to the voltage drop of the preset duration comprises:
 determining a reference value corresponding to the preset duration;
 comparing the voltage drop with the reference value; and
 determining that the battery is abnormal upon determining that the voltage drop of the preset duration is greater than the reference value.

16. The method of claim 15, wherein the reference value is determined according to at least one of capacity, material, usage frequency, and aging degree of the battery.

17. The method of claim 14, wherein when the terminal device is charged more than a preset number of times,
 determining the voltage drop of the battery of the preset duration according to whether the terminal device is charged for the first time and the voltage detected in real time comprises:
  determining a preset number of voltage drops by determining the voltage drop of the preset duration in each of a preset number of previous charging processes before present charging;
 determining whether the battery is abnormal according to the voltage drop of the preset duration comprises:
  calculating an average value of the preset number of voltage drops;
  determining a difference between the voltage drop of the preset duration after present charging and the average value; and
  determining that the battery is abnormal upon determining that the difference is greater than a preset threshold corresponding to the preset threshold.

18. The method of claim 14, wherein when the terminal device is charged less than a preset number of times,
 determining the voltage drop of the battery of the preset duration according to whether the terminal device is charged for the first time and the voltage detected in real time comprises:
  acquiring a plurality of voltage drops by acquiring the voltage drop of the preset duration in each of a plurality of previous charging processes before present charging,
  wherein the number of voltage drops acquired is equal to the number of times of charging of the terminal device; and
 determining whether the battery is abnormal according to the voltage drop of the preset duration comprises:
  calculating an average value of the plurality of voltage drops;
  determining a difference between the voltage drop of the preset duration after present charging and the average value; and
  determining that the battery is abnormal upon determining that the difference is greater than a preset threshold.

* * * * *